US012631965B2

(12) United States Patent
Chen et al.

(10) Patent No.: US 12,631,965 B2
(45) Date of Patent: May 19, 2026

(54) POSITIVE PHOTOSENSITIVE RESIN COMPOSITION FOR LOW-TEMPERATURE PROCESS AND METHOD FOR PREPARING PHOTORESIST FILM

(71) Applicant: eChem Solutions Corp., Taoyuan (TW)

(72) Inventors: Kuan-Ming Chen, Taoyuan (TW); Chi-Yu Lai, Taoyuan (TW); Chi-sung Chen, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 0 days.

(21) Appl. No.: 17/680,360

(22) Filed: Feb. 25, 2022

(65) Prior Publication Data

US 2022/0276559 A1 Sep. 1, 2022

(30) Foreign Application Priority Data

Feb. 26, 2021 (TW) ................................ 110107006

(51) Int. Cl.

*G03F 7/039* (2006.01)
*G03F 7/16* (2006.01)

(Continued)

(52) U.S. Cl.

CPC ............ *G03F 7/0392* (2013.01); *G03F 7/162* (2013.01); *G03F 7/2006* (2013.01); *G03F 7/322* (2013.01); *G03F 7/38* (2013.01); *G03F 7/40* (2013.01)

(58) Field of Classification Search

CPC .......... G03F 7/0392; G03F 7/322; G03F 7/40; G03F 7/0226; G03F 7/0233; G03F 7/168; G03F 7/0048

See application file for complete search history.

(56) References Cited

U.S. PATENT DOCUMENTS 6,165,676 A * 12/2000 Hattori .................. B41C 1/1008 430/905
6,379,860 B1 * 4/2002 Fujimori ............... G03F 7/0392 430/914

(Continued)

FOREIGN PATENT DOCUMENTS

CN 101794073 A 8/2010
CN 104007617 A 8/2014

(Continued)

OTHER PUBLICATIONS https://www.fishersci.com/shop/products/ethyl-3-ethoxypropionate-99-pure-stabilized-thermo-scientific/AC269490010 (Year: 2023).*

(Continued)

*Primary Examiner* — Jonathan Johnson
*Assistant Examiner* — Alexander N. Lee

(57) ABSTRACT

A positive photosensitive resin composition for a low-temperature process includes an alkali-soluble phenolic resin, a compound with quinonediazide group, a mixed solvent and at least one additive. The mixed solvent includes a first solvent and a second solvent. The first solvent has a volatilization rate of more than 50 relative to a volatilization rate of butyl acetate of 100, and the second solvent has a boiling point between 150° C. and 200° C. The at least one additive has a molecular weight of 500-5000 and a structural unit as Formula (I), wherein $R_1$ is selected from a group consisting of hydrogen, hydroxyl group, C1-C5 alkyl group, phenyl group, halogen atoms and cyano group, $R_2$ is selected from a group consisting of hydrogen, acid radical, benzene and derivatives thereof, phenols, benzoic acid and derivatives thereof and aromatic heterocycles, and n is 10-80. It is also provided a method for preparing a photoresist film (Continued)

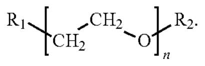

Formula (I)

10 Claims, 1 Drawing Sheet

(51) Int. Cl.

| | |
|---|---|
| ***G03F 7/20*** | (2006.01) |
| ***G03F 7/32*** | (2006.01) |
| ***G03F 7/38*** | (2006.01) |
| ***G03F 7/40*** | (2006.01) |

(56) References Cited

U.S. PATENT DOCUMENTS

| | | | | |
|---|---|---|---|---|
| 9,529,260 | B1 * | 12/2016 | Chang | G03F 7/0048 |
| 2003/0022101 | A1 * | 1/2003 | Lee | G03F 7/0397 430/326 |
| 2005/0079436 | A1 * | 4/2005 | Takahashi | G03F 7/0233 430/141 |
| 2009/0305164 | A1 * | 12/2009 | Lingier | B41C 1/1016 430/302 |
| 2011/0318686 | A1 * | 12/2011 | Li | G03F 7/0233 430/270.1 |
| 2014/0366759 | A1 * | 12/2014 | Tria | G03F 7/202 101/401.1 |
| 2015/0168835 | A1 * | 6/2015 | Lee | G03F 7/0048 430/270.1 |
| 2018/0046081 | A1 | 2/2018 | Miyake et al. | |
| 2020/0073238 | A1 * | 3/2020 | Zi | G03F 7/039 |

FOREIGN PATENT DOCUMENTS

| | | | |
|---|---|---|---|
| JP | H08179499 | A | 7/1996 |
| JP | 2012208323 | A | 10/2012 |
| TW | 202024794 | A | 7/2020 |
| TW | 202043304 | A | 12/2020 |

OTHER PUBLICATIONS https://www.stepan.com/content/stepan-dot-com/en/products-markets/product/POLYSTEPTSP16.html (Year: 2013).*

Hoon Suk Rho, Henk-Willem Veltkamp, Danielle Baptista, ,"A 3D polydimethylsiloxane microhourglass-shaped channel array made by reflowing photoresist structures for engineering a blood capillary network", Methods, vol. 190, 2021, p. 63-71, available online Apr. 2020 (Year: 2020).*

* cited by examiner

POSITIVE PHOTOSENSITIVE RESIN COMPOSITION FOR LOW-TEMPERATURE PROCESS AND METHOD FOR PREPARING PHOTORESIST FILM

FIELD OF THE INVENTION

The present invention relates to a positive photosensitive resin composition and a photoresist film preparing method, and more particularly to a positive photosensitive resin composition for a low-temperature process.

BACKGROUND OF THE INVENTION

For the current photosensitive resin composition, pressure reduction or vacuum drying is performed to take a large part of a solvent out in a photoresist film preparing process so that forming the composition to a film. Pre-bake is then performed to dry the solvent off and to improve adhesion of the film. Exposure, development and post-bake are further performed to form a photoresist film with a pattern of half-truncated cylinder.

Pressure value of pressure reduction or vacuum drying and temperature of bake both affect formation and quality of the photoresist film. For example, lower pressure may result in the solvent's explosive boil which therefore results in the film having an uneven surface; higher pressure may result in the solvent's failure in drying off which therefore result in the film too soft or failure in formation. Under the premise of the requirements of adhesion and photoresist pattern, the current photosensitive resin composition is not suitable for a low-temperature process. Therefore, implementation of a low-temperature process requires development of new photosensitive resin compositions and on the other hand new photosensitive resin compositions contribute to development of the low-temperature process.

SUMMARY OF THE INVENTION

An embodiment of the present invention provides a photosensitive resin composition for a low-temperature process.

Another embodiment of the present invention provides a photoresist film prepared by a low-temperature process. The photoresist film has proper sensitivity and remaining film thickness (RFT). Adhesion of the film is good, and the film's photoresist pattern meets the requirement.

Another embodiment of the present invention provides a photoresist film preparing method, omits the high-temperature bake step and reduce the degree of pressure reduction.

A positive photosensitive resin composition for a low-temperature process provided by an embodiment of the present invention comprises an (A) alkali-soluble phenolic resin, a (B) compound with a quinonediazide group, a (C) mixed solvent, and (D) at least one additive. The (C) mixed solvent comprises a (C-1) first solvent and a (C-2) second solvent, the (C-1) first solvent has a volatilization rate of greater than 50 relative to a volatilization rate of butyl acetate, wherein the volatilization rate of the butyl acetate is defined as 100, and the (C-2) second solvent has a boiling point between 150° C. and 200° C. The (D) at least one additive has a molecular weight of 500-5000 and a structural unit as shown in Formula (I), wherein in Formula (I) $R_1$ is selected from a group consisting of hydrogen, hydroxyl group, C1-C5 alkyl group, phenyl group, halogen atoms and cyano group, $R_2$ is selected from a group consisting of hydrogen, acid radical, benzene and derivatives thereof, phenols, benzoic acid and derivatives thereof and aromatic heterocycles, and n is 10-80, Formula (I)

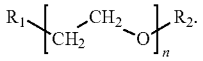

In an embodiment of the present invention, the above-mentioned (A) alkali-soluble phenolic resin accounts for 100 parts by weight, the (C) mixed solvent accounts for 400-1500 parts by weight, and a weight ratio of the (C-1) first solvent to the (C-2) second solvent is between 90:10 to 50:50.

In an embodiment of the present invention, the above-mentioned (A) alkali-soluble phenolic resin accounts for 100 parts by weight, and the (B) compound with quinonediazide group accounts for 20-40 parts by weight.

In an embodiment of the present invention, the above-mentioned (A) alkali-soluble phenolic resin accounts for 100 parts by weight, and the (D) at least one additive accounts for 20-40 parts by weight.

In an embodiment of the present invention, the above-mentioned (C-1) first solvent is selected from a group consisting of butyl acetate, propylene glycol monomethyl ether (PGME), n-propyl propionate (NPP), isobutyl alcohol (IBA), isopropyl alcohol (IPA), isobutyl acetate (IBAC) and methyl isobutyl ketone (MIBK), and the (C-2) second solvent is selected from a group consisting of ethyl 3-ethoxypropionate, propylene glycol n-butyl ether (PnB), diethylene glycol methyl ether (DM), cyclohexanone (ANONE), propylene glycol diacetate (PGDA), dimethyl formamide (DMF), butyl methoxyacetate (MBA) and ethyl lactate (EL).

In an embodiment of the present invention, the above-mentioned (C-1) first solvent is butyl acetate, and the (C-2) second solvent is ethyl 3-ethoxypropionate.

In an embodiment of the present invention, the above-mentioned (C) mixed solvent accounts for 70-90 parts by weight.

In an embodiment of the present invention, the above-mentioned (D) at least one additive has a structural unit as shown in Formula (II), wherein m is 10-30, Formula (II)

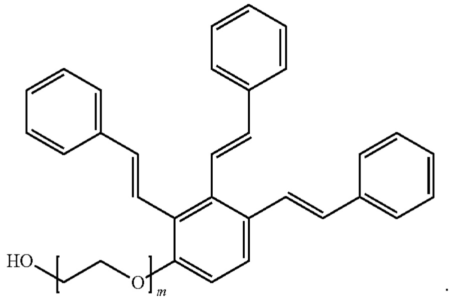

In an embodiment of the present invention, the above-mentioned positive photosensitive resin composition for a low-temperature process further comprises a surfactant, a contrast enhancer, an adhesion auxiliary, or a combination thereof.

An embodiment of the present invention also provides a photoresist film preparing method which comprises a coating step of coating the above-mentioned positive photosensitive resin composition onto a substrate; a bake step of baking the positive photosensitive resin composition at a low temperature; an exposure step of exposing the positive photosensitive resin composition; and a development step for developing the positive photosensitive resin composition.

In an embodiment of the present invention, the above-mentioned bake step further comprises a pre-bake step of pre-baking the positive photosensitive resin composition at a temperature not greater than 90° C. before the exposure step, and a post-bake step of post-baking the positive photosensitive resin composition at a temperature not greater than 90° C. after the development step.

In an embodiment of the present invention, the above-mentioned pre-bake step is performed with a hot plate at 80° C., and the post-bake step is performed with a hot plate at 85° C.

In an embodiment of the present invention, the above-mentioned preparing method further comprises a pressure reduction and drying step of drying the positive photosensitive resin composition under a reduced pressure before the bake step, and the reduced pressure is greater than 20 Pa.

In an embodiment of the present invention, the above-mentioned reduced pressure in the pressure reduction and drying step is 1500 Pa.

Because the composition of some embodiments of the present invention comprises mixed solvent and the at least one additive, wherein the first solvent of the mixed solvent has the volatilization rate of more than 50 relative to the volatilization rate of butyl acetate of 100, the second solvent has the boiling point between 150° C. and 200° C., and the at least one additive has the molecular weight of 500-5000 and the structural unit as shown in Formula (I), the composition is therefore suitable for a low-temperature process. The photoresist film from the composition therefore also has proper sensitivity, good performance in remaining film thickness (RFT), good adhesion, and photoresist pattern which meets the requirement. Because the method of some embodiments of the present invention uses the above-mentioned composition, the bake at the high temperature is therefore omitted, and this method is conductive to omission of a great-degree pressure reduction.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1A:
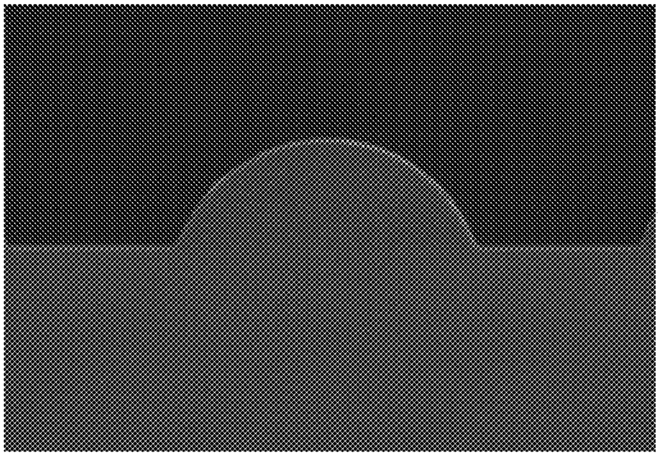
FIG. 1A is a schematic view of a figure of a photoresist pattern according to an embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The low temperature mentioned in this disclosure is not particularly limited unless otherwise defined. However, the low temperature is preferably less than or equal to 150° C., less than or equal to 100° C., and most preferably is less than or equal to 90° C.

Positive Photosensitive Resin Composition

An embodiment of this invention provides a positive photosensitive resin composition for a low-temperature process. The positive photosensitive resin composition in some embodiments of this invention includes an (A) alkali-soluble phenolic resin, a (B) compound having a quinonediazide group which is used as a photosensitizer, a (C) mixed solvent and (D) at least one additive.

(A) Alkali-Soluble Phenolic Resin

The (A) alkali-soluble phenolic resin in some embodiments of this invention is not particularly limited. However, in some embodiments, the (A) alkali-soluble phenolic resin can be obtained from polycondensation of phenols and aldehydes under a catalyst such as an inorganic acid or an organic acid.

In some embodiments of this invention, the phenols used for the (A) alkali-soluble phenolic resin may include cresols (e.g., o-cresol, m-cresol, p-cresol), xylenols (e.g., 3,5-xylenol, 2,5-xylenol, 2,3-xylenol, 3,4-xylenol), trimethylphenols (e.g., 2,3,4-trimethylphenol, 2,3,5-trimethylphenol, 2,4,5-trimethylphenol, 3,4,5-trimethylphenol), tert-butylphenols (e.g., 2-tert-butylphenol, 3-tert-butylphenol, 4-tert-butylphenol), methoxyphenols (e.g., 2-methoxyphenol, 3-methoxyphenol, 4-methoxyphenol, 2,3-dimethoxyphenol, 2,5-dimethoxyphenol, 3,5-dimethoxyphenol), ethylphenols (e.g., 2-ethylphenol, 3-ethylphenol, 4-ethylphenol, 2,3-diethylphenol, 3,5-diethylphenol, 2,3,5-triethylphenol, 3,4,5-triethylphenol), chlorophenols (e.g., o-chlorophenol, m-chlorophenol, p-chlorophenol, 2,3-dichlorophenol), resorcinols (e.g., resorcinol, 2-methylresorcinol, 4-methylresorcinol, 5-methylresorcinol), catechols (e.g., 5-methylcatechol), pyrogallols (e.g., 5-methylpyrogallol), bisphenols (e.g., bisphenol A, B, C, D, E, and F), hydroxymethylated cresols (e.g., 2,6-dihydroxymethyl-p-cresol), and naphthols (e.g., α-naphthol, β-naphthol), which may be used alone or together.

In some embodiments of this invention, the aldehydes used for the (A) alkali-soluble phenolic resin may include formaldehyde, salicylaldehyde, paraformaldehyde, acetaldehyde, benzaldehyde, hydroxybenzaldehyde, and chloroformaldehyde, which may be used alone or together.

In some embodiments of this invention, a weight-average molecular weight (Mw) of the (A) alkali-soluble phenolic resin is 4000-20000, and preferably is 6000-10000. In some embodiments of this invention, the Mw of the (A) alkali-soluble phenolic resin can be determined by gel permeation chromatography (GPC). When the Mw is less than 4000, a high-speed coating with a speed greater than 200 mm/sec cannot be performed and therefore an even thickness cannot be formed. On the other hand, when the Mw is greater than 20000, because the viscosity of the resin is too high, there will be a great difference between the Mw of the polymer taken out from the beginning from a reactor tank and the Mw of the polymer taken out at the end, which may result in instable synthesis.

In some embodiments of this invention, the (A) alkali-soluble phenolic resin can also be novolac resin. In some embodiments of this invention, the (A) alkali-soluble resin may be used alone or used with a combination of various types.

(B) Compound with Quinonediazide Group

In some embodiments of this invention, the (B) compound with quinonediazide group is not particularly limited, but the main function of the (B) compound with quinonediazide group is used as a photosensitizer. The (B) compound with quinonediazide group is usually naphthoquinone diazide sulfonyl chloride (e.g., 1,2-naphthoquinonediazide-5-sulfonyl chloride, 1,2-naphthoquinonediazide-4-sulfonyl chloride) or benzoquinone diazide sulfonyl chloride, and has a quinonediazide compound obtained by reacting a low-molecular compound or high-molecular compound with a functional group capable of condensing with a quinonediazide compound containing acyl chloride. The functional group herein able to perform the condensation reaction with the quinonediazide compound containing acyl chloride mainly is hydroxyl. The hydroxy compound capable of performing condensation reaction with the quinonediazide compound containing acyl chloride may include hydroxydiphenyl ketones (e.g., hydroquinone, resorcinol, 2,4-dihydroxydiphenyl ketone, 2,3,4-trihydroxydiphenyl ketone, 2,4,6-trihydroxydiphenyl ketone, 2,4,4'-trihydroxydiphenyl ketone, 2,3,4,4'-tetrahydroxydiphenyl ketone, 2,2',4,4'-tetrahydroxydiphenyl ketone, 2,2',3,4,6'-pentahydroxydiphenyl ketone), hydroxyphenylalkanes (e.g., bis(2,4-dihydroxyphenyl)methane, bis(2,3,4-trihydroxyphenyl)methane, bis(2,4-dihydroxyphenyl)propane), hydroxytriphenylmethanes (e.g., 4,4'-3",4"-tetrahydroxy-3,5,3',5'-tetramethyltriphenylmethane, 4,4',2",3",4"-pentahydroxy-3,5,3',5'-tetramethyltriphenylmethane), which may be used alone or together.

In another embodiment of this invention, the (B) compound with quinonediazide group can be a compound obtained by reacting a compound containing a naphthoquinone diazide group with a compound containing a phenolic group, such as a compound obtained by reacting TrisP-PA with naphthoquinone-1,2-diazide-5-sulfonyl chloride. When the (A) alkali-soluble phenolic resin accounts for 100 parts by weight, the (B) compound with quinonediazide group accounts for 20-40 parts by weight.

(C) Mixed Solvent

In some embodiments of this invention, the (C) mixed solvent is not particularly limited. In some embodiments, the (C) mixed solvent may include a (C-1) first solvent and a (C-2) second solvent, wherein the (C-1) first solvent and the (C-2) second solvent account for 70-90 parts by weight in the composition. In some embodiments, the (C) mixed solvent accounts for 400-1500 parts by weight when the (A) alkali-soluble phenolic resin accounts for 100 parts by weight. In some embodiments, the (C-1) first solvent has a volatilization rate higher than 50 (i.e., the relative volatilization rate when the butyl acetate has a volatilization rate of 100). The (C-1) first solvent may be butyl acetate, propylene glycol monomethyl ether (PGME), n-propyl propionate (NPP), isobutyl alcohol (IBA), isopropyl alcohol (IPA), isobutyl acetate (IBAC), methyl isobutyl ketone (MIBK). In some embodiments, the (C-2) second solvent has a boiling point between 150° C. and 200° C. The (C-2) second solvent may be ethyl 3-ethoxypropionate, propylene glycol n-butyl ether (PnB), diethylene glycol methyl ether (DM), diethylene glycol ethyl methyl ether (DEME), cyclohexanone (ANONE), propylene glycol diacetate (PGDA), dimethyl formamide (DMF), butyl methoxyacetate (MBA), ethyl lactate (EL). In some embodiments, a weight ratio of the (C-1) first solvent to the (C-2) second solvent is between 90:10 and 50:50.

(D) At Least One Additive

In some embodiment of this invention, the (D) at least one additive is not particularly limited. In some embodiments, the (D) at least one additive has a molecular weight of 500-5000 and a structural unit shown as in formula (I), wherein $R_1$ is selected from a group consisting of hydrogen, hydroxyl group, C1-C5 alkyl group, phenyl group, halogen atom and cyano group; $R_2$ is selected from a group consisting of hydrogen, acid radical, benzene and derivatives thereof, phenols, benzoic acid and derivatives thereof, and aromatic heterocycles; n is 10-80; the derivatives of benzene may be compounds of benzene substituted by one or more halogen, cyano group, alkyl group, alkoxyl group, cycloalkyl group, heterocycloalkyl group, aryl group, heteroaryl group, hydroxyl group, nitro group and amino group; phenols include phenol and its derivatives, wherein the derivatives may be phenol substituted by one or more halogen, cyano group, alkyl group, alkoxy group, cycloalkyl group, heterocycloalkyl group, aryl group, heteroaryl group, hydroxyl group, nitro group and amino group; the derivatives of benzoic acid may be compounds of benzoic acid substituted by one or more halogen, cyano group, alkyl group, alkoxyl group, cycloalkyl group, heterocycloalkyl group, aryl group, heteroaryl group, hydroxyl group, nitro group and amino group; the hetero atoms of the heterocycle are selected from N, O, and S. For example, the (D) at least one additive is the compound shown as the following formula (i), (ii), (iii), or (iv). The (D) at least one additive accounts for 20-40 parts by weight when the (A) alkali-soluble phenolic resin accounts for 100 parts by weight. In some embodiments of this invention, the (D) at least one additive may include a plurality of additives. That is, in addition to the compound having the structural unit shown as formula (I), the (D) at least one additive may further include surfactant, contrast enhancer, adhesion auxiliary or a combination thereof.

Formula (I)

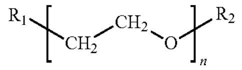

Formula (i)

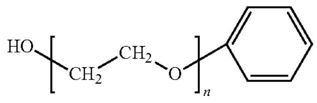,

Formula (ii)

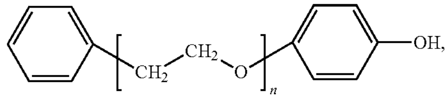,

Formula (iii)

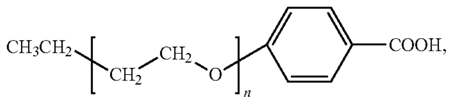,

Formula (iv)

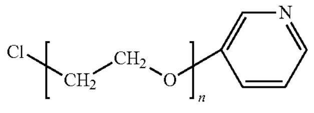,

In some embodiments of this invention, the (D) at least one additive has a structural unit as shown in formula (II), wherein m is 10-30.

Formula (II)

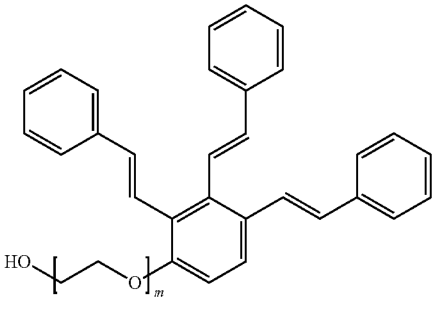

The following examples 1-2 exemplify the (A) alkali-soluble phenolic resin and the (B) compound with quinonediazide group in some embodiments of this invention, and examples 3-7 exemplify the positive photosensitive resin composition in some embodiments of this invention.

Example 1: (A) Alkali-Soluble Phenolic Resin and Preparation Thereof

A nitrogen inlet, an agitator, a heater and a condensing tube are respectively disposed at a four-port separation-type reactor tank having a volume of 10 liter. Nitrogen is introduced for 30 minutes, and then 1 mole cresols, 0.5 mole dihydroxybenzaldehydes and 0.015 mole oxalic acid are added. The mixture is stirred slowly for 6 hours and heated up to 90° C. to perform the condensation reaction at this temperature. The solution is then heated up to 170° C., and vacuum drying is performed under a pressure of 10 mmHg. Thus, the (A) alkali-soluble phenolic resin is obtained after the solvents evaporate.

Example 2: (B) Compound with Quinonediazide Group and Preparation Thereof 0.5 mole TrisP-PA and 1.5 mole naphthoquinone-1,2-diazide-5-sulfonyl chloride are dissolved in dimethylacetamide. The reaction solution is cooled by ice cubes, and then triethylamine as a basic catalyst is added to the reaction solution to make a reaction for 2 hours. Triethylamine is filtered to obtain a filtrate, and then the filtrate is put into water to produce precipitates. The precipitates is collected, washed twice, and then heated up to 50° C., and vacuum drying is performed under a pressure of 10 mmHg. Thus, the (B) compound with quinonediazide group is obtained after drying.

Example 3: Preparation of Positive Photosensitive Resin Composition

The (D) additive accounting 20 parts by weight and having the structure shown as in formula (II) (tristyrylphenol ethoxylated) and then the (C) mixed solvent with the weight ratio of n-butyl acetate (NBAc) and ethyl 3-ethoxypropionate (EEP) of 80:20 are added to the (A) alkali-soluble phenolic resin accounting 100 parts by weight and the (B) compound with quinonediazide group accounting 30 parts by weight. The solution is mixed, stirred and filtered with a 0.45 μm filter to obtain a composition 1 having a solvent of 80 wt %. The (A) alkali-soluble phenolic resin used herein can be the (A) alkali-soluble phenolic resin in example 1, and the (B) compound with quinonediazide group used herein may be the (B) compound with quinonediazide group in Example 2.

Formula (II)

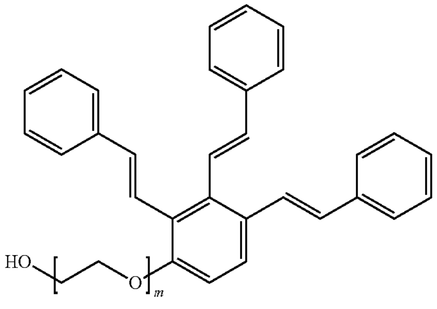

Examples 4-7: Preparations of Positive Photosensitive Resin Composition 4-7

The difference between Example 4 and Example 3 is that the additive in Formula (II) in Example 4 accounts 30 parts by weight, and the rest is the same. The difference between Example 5 and Example 3 is that the additive in Formula (II) in Example 5 accounts 40 parts by weight. The difference between Example 6 and Example 3 is that the weight ratio of NBAc to EEP in Example 6 is changed to 90:10. The difference between Example 7 and Example 3 is that the weight ratio of NBAc to EEP is changed to 70:30, and the rest is the same.

The disclosure further discloses Comparative Examples 1-6. In Comparative Examples 1-2, the weight ratio of NBAc to EEP is changed. In Comparative Examples 3-5 the type of the second solvent is changed. In Comparative Example 6, the amount of the additive in Formula (II) is changed. The detailed descriptions are as follows.

Compared to Example 3, Comparative Example 1 uses a mixed solvent of NBAc and EEP at a weight ratio of 95:5 to prepare a positive photosensitive resin composition a. Comparative Example 2 uses a mixed solvent of NBAc and EEP at a weight ratio of 45:55 to prepare a positive photosensitive resin composition b. Comparative Example 3 uses a mixed solvent of NBAc and di(propylene glycol) methyl ether acetate (DPMA, having a boiling point of 209° C.) at a weight ratio of 95:5 to prepare a positive photosensitive resin composition c. Comparative Example 4 uses a mixed solvent of NBAc and propylene glycol monomethyl ether acetate (PGMEA, having a boiling point of 146° C.) at a weight ratio of 80:20 to prepare a positive photosensitive resin composition d. Comparative Example 5 uses a mixed solvent of NBAc and PGMEA at a weight ratio of 50:50 to prepare a positive photosensitive resin composition e. Comparative Example 6 does not use the additive in Formula (II) to prepare a positive photosensitive resin composition f. The differences among the compositions 1-5 of Example 3-7 and the compositions a-f of Comparative Examples 1-6 are listed in Table 1 as follows.

TABLE 1

| | Composition | (C-1) First solvent | (C-2) Second solvent | Weight ratio of (C-1) first solvent to (C-2) second solvent | (D) Additive (parts by weight) |
|---|---|---|---|---|---|
| Example 3 | 1 | NBAc | EEP | 80:20 | 20 |
| Example 4 | 2 | NBAc | EEP | 80:20 | 30 |
| Example 5 | 3 | NBAc | EEP | 80:20 | 40 |
| Example 6 | 4 | NBAc | EEP | 90:10 | 20 |

TABLE 1-continued

| | Composition | (C-1) First solvent | (C-2) Second solvent | Weight ratio of (C-1) first solvent to (C-2) second solvent | (D) Additive (parts by weight) |
|---|---|---|---|---|---|
| Example 7 | 5 | NBAc | EEP | 70:30 | 20 |
| Comparative Example 1 | a | NBAc | EEP | 95:5 | 20 |
| Comparative Example 2 | b | NBAc | EEP | 45:55 | 20 |
| Comparative Example 3 | c | NBAc | DPMA | 95:5 | 20 |
| Comparative Example 4 | d | NBAc | PGMEA | 80:20 | 20 |
| Comparative Example 5 | e | NBAc | PGMEA | 50:50 | 20 |
| Comparative Example 6 | f | NBAc | EEP | 80:20 | 0 |

In some embodiments of this invention, a photoresist film preparing method is also provided. The method includes steps of: a coating step of coating a positive photosensitive resin composition onto a substrate; a bake step of baking the positive photosensitive resin composition at a low temperature; an exposure step of exposing the positive photosensitive resin composition; and a development step for developing the positive photosensitive resin composition. The photoresist film preparing method in some embodiments of this invention is suitable for preparing a photoresist film with the above-mentioned positive photosensitive resin composition. The above-mentioned positive photosensitive resin composition is also suitable for the preparing method provide in the disclosure herein. In an embodiment of this invention, the bake step further includes a pre-bake step and a post-bake step. The pre-bake step is performed at a temperature not greater than 90° C. before the exposure step, and the post-bake step is performed at a temperature not greater than 90° C. after the exposure step. Particularly, the pre-bake step is further performed with a hot plate at 80° C., and the post-bake step is further performed with a hot plate at 85° C. In some embodiments of this invention, preferably, the positive photosensitive resin composition is dried under a reduced pressure before the low-temperature bake step. In a preferred embodiment of this invention, the reduced pressure in the drying step is greater than 20 Pa, and the reduced pressure may be far greater than 20 Pa, such as to 1500 Pa. Example 8 exemplifies the photoresist film preparing method in some embodiments of this invention.

Example 8: Photoresist Film Preparing Method

The compositions 1-5 and a-f are respectively coated on the substrate by a spin coating method. Vacuum-pumping/pressure reduction to 1500 Pa is performed and then the bake step with the hot plate at 80° C. for 180 seconds is performed to obtain a film having a thickness of 1.5 μm, wherein the degree of the vacuum-pumping/pressure reduction can be adjusted according to a photoresist pattern to be formed. The exposure is performed, and then the development is performed with 2.38% TMAH for 60 seconds, and then the bake step is performed with the hot plate at 85° C. for 180 seconds to obtain the photoresist film.

This invention further evaluates the photoresist films of the compositions 1-5 and a-f and prepared by the above-mentioned method. The items to be evaluated include: whether the photoresist pattern is the required pattern, sensitivity of the film and the remaining film thickness (RFT). Example 9 exemplifies the evaluation methods and presents the evaluation results of each photoresist film.

Example 9: Evaluation Methods and Evaluation Results

Figure 1B:
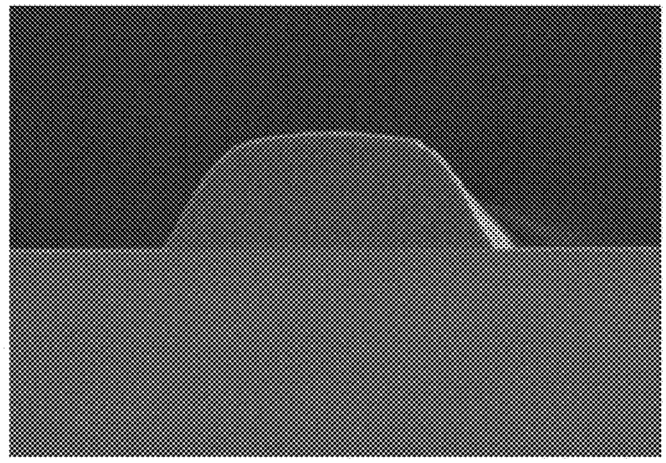
FIG. 1B is a schematic view of a figure of a photoresist pattern according to another embodiment of the present invention.
Figure 1C:
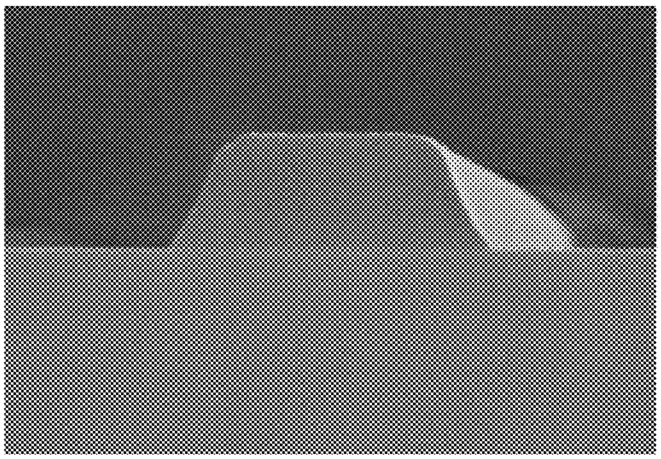
FIG. 1C is a schematic view of a figure of a photoresist pattern according to further another embodiment of the present invention.

Pattern evaluation: the field emission scanning electron microscope (FESEM) U-8010 is used to determine the post-baked pattern. Specifically, the evaluation is rated as "○" as shown in FIG. 1A when the obtained pattern conforms to the half-cylinder, which is the expected result. The evaluation is rated as "Δ" as shown in FIG. 1B when the obtained pattern partially conforms to the half cone half-cylinder. The evaluation is rated as "X" as shown in FIG. 1C when the obtained pattern does not conform to the half-cylinder Sensitivity evaluation: the Nikon Stepper FX-601 is used for the exposure and an optical microscope is used to observe the exposure. The exposure pattern is 4 μm in line width and line spacing, and the three-dimensional structure of line width and line spacing is used to determine how much exposure energy (Eop, unit: mJ) is needed. The evaluation is rated as "○" when 20 mJ<Eop≤50 mJ. The evaluation is rated as "Δ" when 50 mJ<Eop≤60 mJ. The evaluation is rated as "X" when Eop≤20 or 60 mJ<Eop.

RFT evaluation: the thickness meter F50 is used to measure the thickness of the film before and after the development step, to calculate a percentage of the thickness after the development step to the thickness before the development step (unit: %). The evaluation is rated as "○" when the RFT is greater than 90%. The evaluation is rated as "Δ" when the RFT is greater than 70% but less than 90%. The evaluation is rated as "X" when the RFT is less than 70%. The results of the evaluations of each of the photoresist films are listed in Table 2 as follows. A greater RFT means higher chemical resistance.

TABLE 2

| | Compositions of the photoresist films | Pattern evaluation | Sensitivity evaluation | RFT evaluation |
|---|---|---|---|---|
| Example 3 | 1 | ○ | ○ | ○ |
| Example 4 | 2 | ○ | ○ | ○ |
| Example 5 | 3 | ○ | ○ | ○ |
| Example 6 | 4 | ○ | ○ | ○ |
| Example 7 | 5 | ○ | ○ | ○ |
| Comparative Example 1 | a | Δ | Δ | ○ |
| Comparative Example 2 | b | ○ | × | × |
| Comparative Example 3 | c | × | Δ | × |
| Comparative Example 4 | d | × | ○ | Δ |
| Comparative Example 5 | e | Δ | ○ | Δ |
| Comparative Example 6 | f | Δ | × | ○ |

The results of the evaluations shown in Table 2 confirm that the positive photosensitive resin composition in some embodiments of this invention has the following advantages: (1) has good sensitivity, (2) is suitable for a low-temperature process and can meet the requirements of adhesion and photoresist pattern under the low-temperature process. The composition has good film forming property, and therefore is suitable for continuous micro-nanoimprint lithography such as roll-to-roll (R2R) process, slot die coating method and other processes in which the temperature does not exceed 90° C. Some embodiments of this invention lower the temperature required in the photoresist film's preparing method, omit the high-temperature bake step (over 90° C.) and further reduce the degree of pressure reduction/vacuum drying. As a result, the desired photoresist film can be obtained without the rapid and great-degree pressure reduction.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A positive photosensitive resin composition, comprising:

an (A) alkali-soluble phenolic resin, obtained from polycondensation of phenols and aldehydes;

a (B) compound with quinonediazide group;

a (C) mixed solvent, comprising a (C-1) first solvent and a (C-2) second solvent, wherein the (C-1) first solvent has a volatilization rate of greater than 50 relative to a volatilization rate of butyl acetate, wherein the volatilization rate of the butyl acetate is defined as 100, and the (C-2) second solvent has a boiling point between 150° C. and 200° C.; and (D) at least one additive, having a molecular weight of 500-5000 and a structural unit as shown in Formula (I) as follow, wherein in Formula (I) $R_1$ is selected from a group consisting of hydrogen, hydroxyl group, C1-C5 alkyl group, phenyl group, halogen atoms and cyano group, $R_2$ is selected from a group consisting of hydrogen, acid radical, benzene and derivatives thereof, phenols, benzoic acid and derivatives thereof and aromatic heterocycles, and n is 10-80, Formula (I)

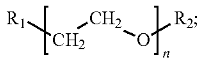

wherein the (A) alkali-soluble phenolic resin accounts for 100 parts by weight, the (C) mixed solvent accounts for 400-1500 parts by weight, the (B) compound with quinonediazide group accounts for 20-40 parts by weight, the (D) at least one additive accounts for 20-40 parts by weight, and a weight ratio of the (C-1) first solvent to the (C-2) second solvent is between 90:10 to 50:50;

wherein the (C-1) first solvent is selected from a group consisting of butyl acetate (NBAc), propylene glycol monomethyl ether (PGME), n-propyl propionate (NPP), isobutyl alcohol (IBA), isopropyl alcohol (IPA), isobutyl acetate (IBAC) and methyl isobutyl ketone (MIBK), and the (C-2) second solvent is selected from a group consisting of ethyl 3-ethoxypropionate, propylene glycol n-butyl ether (PnB), diethylene glycol methyl ether (DM), cyclohexanone (ANONE), propylene glycol diacetate (PGDA), dimethyl formamide (DMF), butyl methoxyacetate (MBA) and ethyl lactate (EL); and wherein the positive photosensitive resin composition is adapted to make a photoresist film through steps comprising:

a coating step of coating the positive photosensitive resin composition onto a substrate;

a pre-bake step at a temperature not greater than 90° C.;

an exposure step;

a development step; and a post-bake step at a temperature not greater than 90° C.;

wherein the photoresist film made from the positive photosensitive resin composition has a pattern conforming to a half-cylinder, and a remaining film thickness value of greater than 90%.

2. The positive photosensitive resin composition according to claim 1, wherein the (C-1) first solvent is butyl acetate, and the (C-2) second solvent is ethyl 3-ethoxypropionate.

3. The positive photosensitive resin composition according to claim 1, wherein the (C) mixed solvent accounts for 70-90 wt % of the composition.

4. The positive photosensitive resin composition according to claim 1, wherein the (D) at least one additive has a structural unit as shown in Formula (II), wherein m is 10-30, Formula (II)

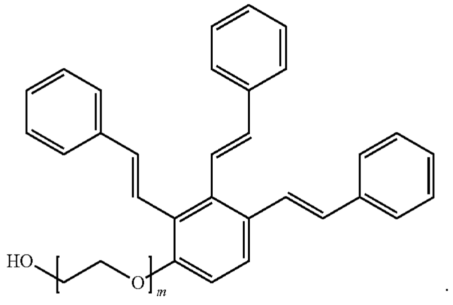

5. The positive photosensitive resin composition according to claim 1, further comprising a surfactant, a contrast enhancer, an adhesion auxiliary, or a combination thereof.

6. A photoresist film preparing method, comprising:

a coating step of coating a positive photosensitive resin composition of claim 1 onto a substrate;

a bake step of baking the positive photosensitive resin composition at a low temperature;

an exposure step of exposing the positive photosensitive resin composition; and a development step for developing the positive photosensitive resin composition.

7. The photoresist film preparing method according to claim 6, wherein the bake step further comprises a pre-bake step of pre-baking the positive photosensitive resin composition at a temperature not greater than 90° C. before the exposure step, and a post-bake step of post-baking the positive photosensitive resin composition at a temperature not greater than 90° C. after the development step.

8. The photoresist film preparing method according to claim 7, wherein the pre-bake step is performed with a hot plate at 80° C., and the post-bake step is performed with a hot plate at 85° C.

9. The photoresist film preparing method according to claim 6, further comprising a pressure reduction and drying step of drying the positive photosensitive resin composition under a reduced pressure before the bake step, and the reduced pressure is greater than 20 Pa.

10. The photoresist film preparing method according to claim 9, wherein the reduced pressure in the pressure reduction and drying step is 1500 Pa.

* * * * *